United States Patent [19]
Ngan

[11] Patent Number: 5,961,793
[45] Date of Patent: Oct. 5, 1999

[54] METHOD OF REDUCING GENERATION OF PARTICULATE MATTER IN A SPUTTERING CHAMBER

[75] Inventor: Kenny K. Ngan, Fremont, Calif.

[73] Assignee: Applied Materials, Inc., Santa Clara, Calif.

[21] Appl. No.: 08/741,708

[22] Filed: Oct. 31, 1996

[51] Int. Cl.$^6$ ................................................ C23C 14/34
[52] U.S. Cl. .............................. 204/192.12; 204/192.32; 204/298.06; 204/298.16; 204/298.31; 204/298.34; 204/298.08
[58] Field of Search .................. 204/192.12, 192.32, 204/298.06, 298.08, 298.16, 298.31, 298.34; 118/723 I, 723 IR; 216/67, 68; 156/345

[56] References Cited

U.S. PATENT DOCUMENTS

| | | | |
|---|---|---|---|
| 3,594,295 | 7/1971 | Meckel et al. | 204/192.12 |
| 4,336,118 | 6/1982 | Patten et al. | 204/192.12 |
| 4,362,632 | 12/1982 | Jacob | 422/186.04 |
| 4,495,221 | 1/1985 | Broadbent | 438/679 |
| 4,626,312 | 12/1986 | Tracy | 156/345 |
| 4,661,228 | 4/1987 | Mintz | 204/192.25 |
| 4,716,491 | 12/1987 | Ohno et al. | 361/230 |
| 4,717,462 | 1/1988 | Homma et al. | 204/298.06 |
| 4,756,815 | 7/1988 | Turner et al. | 204/298.25 |
| 4,792,732 | 12/1988 | O'Loughlin | 315/334 |
| 4,810,342 | 3/1989 | Inoue | 204/192.17 |
| 4,816,126 | 3/1989 | Kamoshida et al. | 204/192.3 |
| 4,818,723 | 4/1989 | Yen | 438/647 |
| 4,824,544 | 4/1989 | Mikalesen et al. | 204/298.06 |
| 4,842,703 | 6/1989 | Class et al. | 204/192.12 |
| 4,844,775 | 7/1989 | Keeble | 216/68 |
| 4,865,712 | 9/1989 | Mintz | 204/298.16 |
| 4,871,421 | 10/1989 | Ogle et al. | 438/710 |
| 4,897,709 | 1/1990 | Yokoyama et al. | 257/301 |
| 4,918,031 | 4/1990 | Flamm et al. | 438/695 |
| 4,925,542 | 5/1990 | Kidd | 427/531 |
| 4,941,915 | 7/1990 | Matsuoka et al. | 204/298.12 |
| 4,944,961 | 7/1990 | Lu et al. | 427/531 |
| 4,948,458 | 8/1990 | Ogle | 438/729 |

(List continued on next page.)

FOREIGN PATENT DOCUMENTS

| | | |
|---|---|---|
| 0297502 | 6/1988 | European Pat. Off. . |
| 0520519 | 12/1992 | European Pat. Off. . |
| 0607797 | 1/1994 | European Pat. Off. . |
| 0680072 | 4/1995 | European Pat. Off. . |
| 58-063139 | 4/1983 | Japan . |
| 58-19363 | 4/1983 | Japan . |
| 59-190363 | 10/1984 | Japan . |
| 61-190070 | 8/1986 | Japan . |

(List continued on next page.)

OTHER PUBLICATIONS

Demaray et al., "Aluminum Alloy Planarization for Topography Control of Multilevel VLSI Interconnect," Proceedings—VLSI and Computers: First International Conference on Computer Technology, Systems and Applications, May 11, 1987.

Park et al., "Influences of D.C. Bias on Aluminum Films Prepared with a High Rate Magnetron Sputtering Cathode," Thin Solid Films, 1985.

Hoffman, "Practical Troubleshooting of Vacuum Deposition Processes and Equipment for Aluminum Metallization," Solid State Technology, vol. 21, No. 12, pp. 47–56, Dec. 12, 1978.

(List continued on next page.)

*Primary Examiner*—Nam Nguyen
*Assistant Examiner*—Rodney G. McDonald
*Attorney, Agent, or Firm*—William K. Konard

[57] ABSTRACT

An RF coil for a plasma chamber in a semiconductor fabrication system is conditioned to reduce shedding of particulate matter onto the workpiece. In the illustrated embodiment, the coil is sputtered prior to sputtering the target so as to remove oxides and other contaminants from the surface of the coil. As a result, shedding of particulate matter from target material subsequently deposited onto the coil is reduced.

24 Claims, 4 Drawing Sheets

| | Step 1 | Step 2 | Step 3A | Step 3B |
|---|---|---|---|---|
| Max Step Time | 18.0 Seconds | 30.0 Seconds | 15.0 Seconds | 30.0 Seconds |
| Gate Valve Pos. | Mid | Mid | Full | Mid |
| DC Target Power | 0 Watts | 100 Watts | 0 Watts | 5000 Watts |
| RF Coil Power | 0 Watts | 1500 Watts | 0 Watts | 1500 Watts |
| Gas Flow Rate | 62 scc/min. | 62 scc/min. | Pump Out | 62 scc/min. |

U.S. PATENT DOCUMENTS

| | | | |
|---|---|---|---|
| 4,970,176 | 11/1990 | Tracy et al. | 438/660 |
| 4,990,229 | 2/1991 | Campbell et al. | 204/298.06 |
| 4,999,096 | 3/1991 | Nihei et al. | 204/192.3 |
| 5,065,698 | 11/1991 | Koike | 118/719 |
| 5,091,049 | 2/1992 | Campbell et al. | 216/37 |
| 5,122,251 | 6/1992 | Campbell et al. | 204/298.06 |
| 5,135,629 | 8/1992 | Sawada et al. | 204/192.12 |
| 5,146,137 | 9/1992 | Gesche et al. | 315/111.21 |
| 5,171,412 | 12/1992 | Talieh et al. | 204/192.15 |
| 5,175,608 | 12/1992 | Nihei et al. | 257/751 |
| 5,178,739 | 1/1993 | Barnes et al. | 204/192.12 |
| 5,186,718 | 2/1993 | Tepman et al. | 29/25.01 |
| 5,206,516 | 4/1993 | Keller et al. | 250/492.2 |
| 5,225,740 | 7/1993 | Ohkawa | 315/111.14 |
| 5,231,334 | 7/1993 | Paranjpe | 315/111.14 |
| 5,234,560 | 8/1993 | Kadlec et al. | 204/192.12 |
| 5,241,245 | 8/1993 | Barnes et al. | 315/111.41 |
| 5,280,154 | 1/1994 | Cuomo et al. | 219/121.52 |
| 5,292,393 | 3/1994 | Maydan et al. | 156/345 |
| 5,304,279 | 4/1994 | Coultas et al. | 156/345 |
| 5,312,717 | 5/1994 | Sachdev et al. | 430/313 |
| 5,330,628 | 7/1994 | Demaray et al. | 204/192.12 |
| 5,346,578 | 9/1994 | Benzing et al. | 156/345 |
| 5,361,016 | 11/1994 | Ohkawa et al. | 315/111.14 |
| 5,366,590 | 11/1994 | Kadomura | 438/723 |
| 5,368,685 | 11/1994 | Kumihashi et al. | 216/70 |
| 5,397,962 | 3/1995 | Moslehi | 315/111.51 |
| 5,404,079 | 4/1995 | Ohkuni et al. | 315/111.81 |
| 5,418,431 | 5/1995 | Williamson et al. | 315/111.51 |
| 5,421,891 | 6/1995 | Campbell et al. | 118/723 R |
| 5,427,668 | 6/1995 | Sato et al. | 204/298.05 |
| 5,429,070 | 7/1995 | Campbell et al. | 118/723 R |
| 5,429,710 | 7/1995 | Akiba et al. | 438/714 |
| 5,429,995 | 7/1995 | Nishiyama et al. | 438/788 |
| 5,430,355 | 7/1995 | Paranjpe | 315/111.21 |
| 5,431,799 | 7/1995 | Mosely et al. | 204/298.06 |
| 5,443,995 | 8/1995 | Nulman | 458/654 |
| 5,503,676 | 4/1996 | Shufflebotham et al | 118/723 MR |
| 5,573,595 | 11/1996 | Dible | 118/723 MP |
| 5,639,357 | 6/1997 | Xu | 204/192.3 |

FOREIGN PATENT DOCUMENTS

| | | |
|---|---|---|
| 5152248 | 1/1991 | Japan . |
| 6232055 | 8/1994 | Japan . |
| 6283470 | 10/1994 | Japan . |
| 7176398 | 7/1995 | Japan . |
| 7176399 | 7/1995 | Japan . |
| 2162365 | 1/1986 | United Kingdom . |
| 2231197 | 11/1990 | United Kingdom . |
| WO860623 | 11/1986 | WIPO . |

Hoffman, "Tungsten Titanium Diffusion Barrier Metallization," Solid State Technology, vol. 26, No. 6, pp. 119–126, Jun. 6, 1983.

Hoffman et al., "Planarization of Aluminum Alloy Films During High Rate Sputtering," Thin Solid Films, vol. 153, pp. 369–377, Oct. 26, 1987.

Ahn et al., Effects of Substrate Temperature on Copper Distribution, Resistivity, and Microstructure in Magnetron––Sputtered Al–Cu Films, Thin Solid Films, vol. 153, pp. 409–419, Oct. 26, 1987.

Helmer et al., "Pressure Effects in Planar Magnetron Sputter Deposition," Journal of Vacuum Science & Technology A (Vacuum, Surfaces, and Films), vol. 4, No. 3, pt. 1, pp. 408–412, May–Jun., 1986.

Skelly et al., "Significant Improvement in Step Coverage Using Bias Sputter Aluminum," J. Vac. Sci. Technol., 1986.

Joshi et al., Collimated Sputtering of TiN/Ti Liners into Sub–Half Micron High Aspect Ratio Contacts/Lines, Jun. 9–10, 1992 VMIC Conference 1992, pp. 253–259.

Meikle et al., "Semiconductor Process Considerations for Collimated Source Sputtering of Ti Films," Jun. 9–10, 1992 VMIC Conference, 1992, pp. 289–291.

Van Gogh et al., "Characterization of Improved TiN Films by Controlled Divergence Sputtering," Jun. 9–10, 1992 VMIC Conference, 1992, pp. 310–313.

U.S. application No. 08/511,825 (Atty. Dkt. 885).

U.S. application No. 08/789,960 (Atty. Dkt. 1643).

U.S. application No. 08/733,620, filed Oct. 17, 1996 (Aty. Dk. 1457/PVD/DV).

N. Jiwari et al., "Helicon wave plasma reactor employing single–loop antenna," J. of Vac. Sci. Technol., A 12(4), pp. 1322–1327, Jul./Aug. 1994.

Search report dated Feb. 27, 1997, EPC application No. 96308251.6.

U.S. application No. 08/931,170, filed Sep. 16, 1997 (Aty. Dk. 1812/PVD/DV).

U.S. application No. 08/929,829, filed Sep. 15, 1997 (Aty. Dk. 1730/PVD/DV).

U.S. application No. 08/753,251, filed Nov. 21, 1996 (Aty. Dk. 1657/PVd/DV).

U.S. application No. 08/661,842, filed Jun. 11, 1996, (Atty. Dk. 838/PVD/DV).

U.S. application No. 08/753,251, filed Nov. 21, 1996 (Aty. Dk. 1657/PVD/DV).

U.S. application No. 08/647,184, filed May 9, 1996 (Aty. Dk. 1383/PVD/DV).

U.S. application No. 07/954,860, filed Sep. 30, 1992 (Atty. Dk. 364).

U.S. application No. 08/461,575, filed Sep. 30, 1992 (Atty. Dk. 364.F1).

U.S. application No. 08/310,617, filed Sep. 30, 1992 (Atty. Dk. 364.P1).

U.S. application No. 08/567,601, filed Jun. 2, 1995 (Atty. Dk. 364.P2).

U.S. application No. 08/647,182, filed May 9, 1996 (Atty. Dk. 1186).

U.S. application No. 08/733,620, filed Oct. 17, 1996 (Attorney Docket #1457/PVD/DV).

U.S. application No. 08/680,335, filed Jul. 10, 1996 (Aty. Dk. 1390–CIP/PVD/DV).

U.S. application No. 08/559,345, filed Nov. 15, 1995 (Aty. Dk. 938/PVD/DV).

M. Yamashita, "Sputter Type High Frequency Ion Source for Ion Beam Deposition Apparatus," Jap. J. Appl. Phys., vol. 26, pp. 721–727, 1987.

M. Yamashita, "Fundamental Characteristics of Built–in High Frequency Coil Type Sputtering Apparatus," J. Vac. Sci. Technol., vol. A7, pp. 151–158, 1989.

S.M. Rossnagel et al., "Metal Ion Deposition from Ionized Magnetron Sputtering Discharge," J. Vac. Sci. Technol., vol. B12, pp. 449–453, 1994.

S.M. Rossnagel et al., "Magnetron Sputter Deposition with High Levels of Metal Ionization," Appl. Phys. Lett., vol. 63, pp. 3285–3287, 1993.

S.M. Rossnagel, et al., "Filling Dual Damascene Interconnect Structures with AlCu and Cu Using Ionized Magnetron Deposition," J. Vac. Sci. Technol., vol. B13, pp. 125–129, 1995.

Y–W. Kim et al., "Directed Sputter Deposition of AlCu: Film Microstructure and Chemistry," J. Vac. Sci. Technol., vol. A12, pp. 3169–3175, 1994.

J. Hopwood et al., "Mechanisms for Highly Ionized Magnetron Sputtering," *J. Appl. Phys.*, vol. 78, pp. 758–765, 1995.

P. Kidd, "A Magnetically Confined and ECR Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP (Tokyo)*, pp. 253–260, 1995.

U.S. application No. 08/677,588, filed Jul. 9, 1996 (Atty. Dk. 1402/PVD/DV).

U.S. application No. 08/680,335, filed Jul. 10, 1996 (Aty. Dk. 1390CIP/PVD/DV).

U.S. application No. 08/647,182, filed May 9, 1996 (Atty. Dk. 1186/PVD/DV).

U.S. application No. 08/733,620, filed Oct. 17, 1996 (Aty. Dk. 1457/PVD/DV).

M. Matsuoka et al., Dense Plasma Production and Film Deposition by New High–Rate Sputtering Using an Electric Mirror, *J. Vac. Sci. Technol.*, A7 (4), 2652–2657, Jul./Aug. 1989.

N. Jiwari et al., "Helicon wave plasma reactor employing single–loop antenna," *J. of Vac. Sci. Technol.*, A 12(4), pp. 1322–1327, Jul./Aug. 1994.

Search report dated Feb. 27, 1997, EPC application No. 96308251.6.

U.S. application No. 08/733,620, filed Oct. 17, 1996 (Attorney Docket# 1457/PVD/DV).

|  | Step 1 | Step 2 | Step 3A | Step 3B |
|---|---|---|---|---|
| Max Step Time | 18.0 Seconds | 30.0 Seconds | 15.0 Seconds | 30.0 Seconds |
| Gate Valve Pos. | Mid | Mid | Full | Mid |
| DC Target Power | 0 Watts | 100 Watts | 0 Watts | 5000 Watts |
| RF Coil Power | 0 Watts | 1500 Watts | 0 Watts | 1500 Watts |
| Gas Flow Rate | 62 scc/min. | 62 scc/min. | Pump Out | 62 scc/min. |

Fig. 4

METHOD OF REDUCING GENERATION OF PARTICULATE MATTER IN A SPUTTERING CHAMBER

FIELD OF THE INVENTION

The present invention relates to plasma generators, and more particularly, to a method and apparatus for generating a plasma to sputter deposit a layer of material in the fabrication of semiconductor devices.

BACKGROUND OF THE INVENTION

Low pressure radio frequency (RF) generated plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created adjacent the target impact the surface of the target to dislodge, i.e., "sputter" material from the target. The sputtered materials are then transported and deposited on the surface of the semiconductor wafer.

Sputtered material has a tendency to travel in straight line paths, from the target to the substrate being deposited, at angles which are oblique to the surface of the substrate. As a consequence, materials deposited in etched trenches and holes of semiconductor devices having trenches or holes with a high depth to width aspect ratio, can bridge over causing undesirable cavities in the deposition layer. To prevent such cavities, the sputtered material can be redirected into substantially vertical paths between the target and the substrate by negatively biasing the substrate and positioning appropriate vertically oriented electric fields adjacent the substrate if the sputtered material is sufficiently ionized by the plasma. However, material sputtered by a low density plasma often has an ionization degree of less than 1% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

In order to maximize the energy being coupled from the coil to the plasma, it is desirable to position the coil as close as possible to the plasma itself. At the same time, however, it is also desirable to minimize the generation of particles being shed from interior surfaces. These particles shed from interior surfaces can fall on the wafer itself and contaminate the product. Accordingly, many sputtering chambers have a generally annular-shaped shield enclosing the plasma generation area between the target and the pedestal supporting the wafer. The shield provides a smooth gently curved surface which is relatively easy to clean and protects the interior of the vacuum chamber from being deposited with the sputtering material. In contrast, it is believed that a coil and any supporting structure for the coil generally have relatively sharply curved surfaces from which it would be more difficult to clean away materials deposited from the coil and its supporting structures. In addition, it is believed that the smooth gently curved surface of the shield would tend to shed fewer particles than the sharply curved surfaces of the coil and its supporting structure.

Thus, on the one hand, it would be desirable to place the coil outside the shield (as described in copending application Ser. No. 08/559,345, filed Nov. 15, 1995 for "Method and Apparatus for Launching a Helicon Wave in a Plasma" which is assigned to the assignee of the present application and is incorporated herein by reference) so that the coil is shielded from the material being deposited. Such an arrangement would minimize generation of particles by the coil and its supporting structure and would facilitate cleaning of the chamber. On the other hand, it is desirable to place the coil as close as possible to the plasma generation area inside the shield, to avoid any attenuation by the spacing from the plasma or by the shield itself, and thereby to maximize energy transfer from the coil to the plasma. Accordingly, it has been difficult to increase energy transfer from the coil to the plasma while at the same time minimizing particle generation.

SUMMARY OF THE INVENTION

It is an object of the present invention to provide an improved method and apparatus for generating a plasma within a chamber and for sputter depositing a layer which obviate, for practical purposes, the above-mentioned limitations.

These and other objects and advantages are achieved by, in accordance with one aspect of the invention, a plasma generating apparatus which inductively couples electromagnetic energy from a coil which is treated to remove contaminants prior to commencement of any substantial sputter deposition from the target. Such a treatment has been found to minimize shedding of particles of deposition material from the coil which has been deposited on the coil from the target. As a consequence, contamination of the workpiece by particulate matter shed by the coil may be reduced.

In a preferred embodiment, an apparatus for energizing a plasma within a semiconductor fabrication system to sputter material onto a workpiece may include a semiconductor fabrication chamber having a plasma generation area within the chamber, and a coil carried by the chamber and positioned to couple energy into the plasma generation area, in which the coil is first sputtered with little or no sputtering from the target. This initial sputtering of the coil is believed to remove oxides and other contaminants which can interfere with strong bonding between the surface of the coil and material which is subsequently deposited onto the coil as material is sputtered from the target onto the workpiece.

BRIEF DESCRIPTION OF THE DRAWINGS

FIG. 4 is a chart depicting a process for conditioning the coil of the chamber of FIG. 1.

DETAILED DESCRIPTION OF THE DRAWINGS

Figure 1:
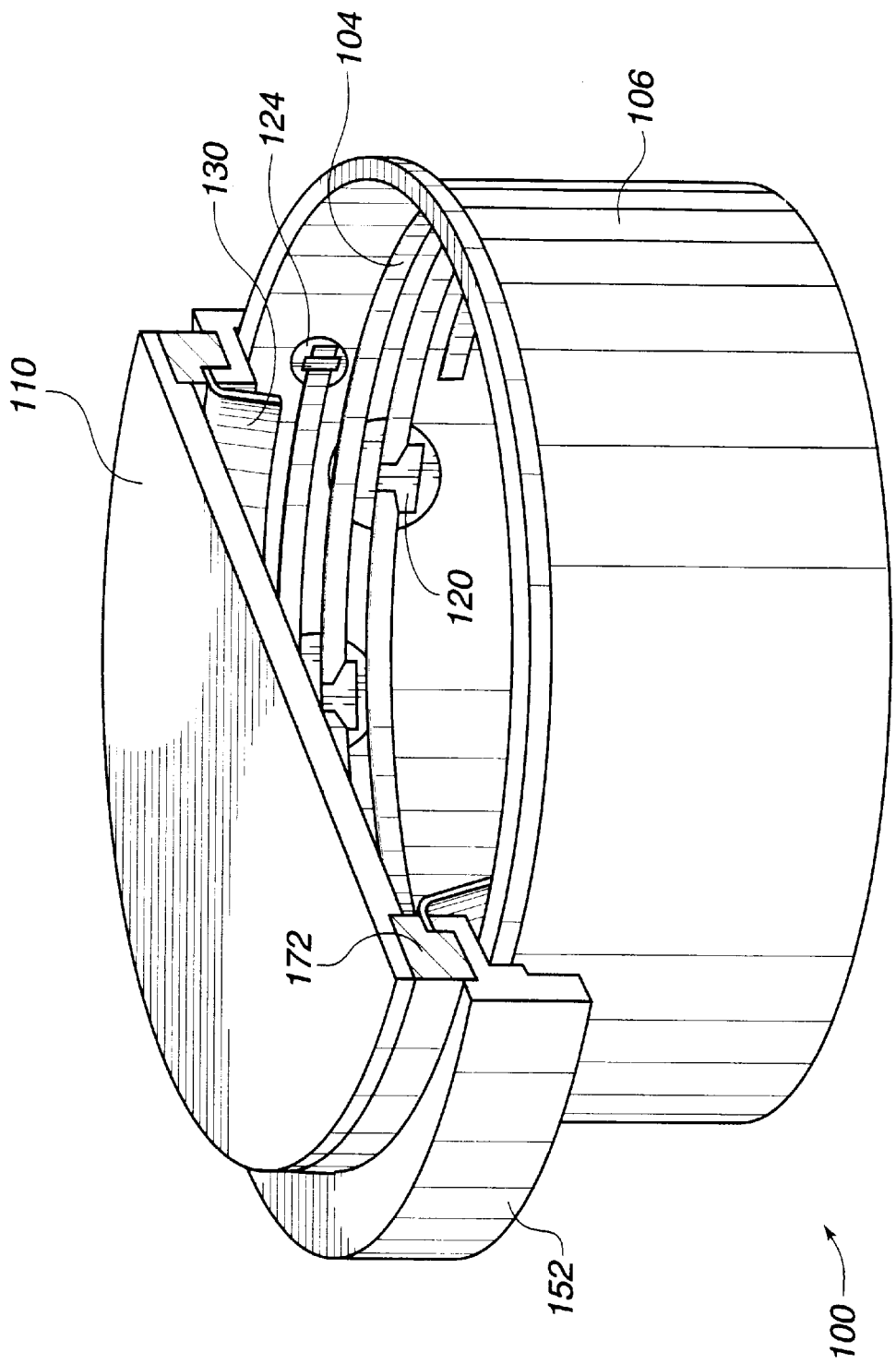
FIG. 1 is a perspective, partial cross-sectional view of a plasma generating chamber in accordance with an embodiment of the present invention.
Figure 2:
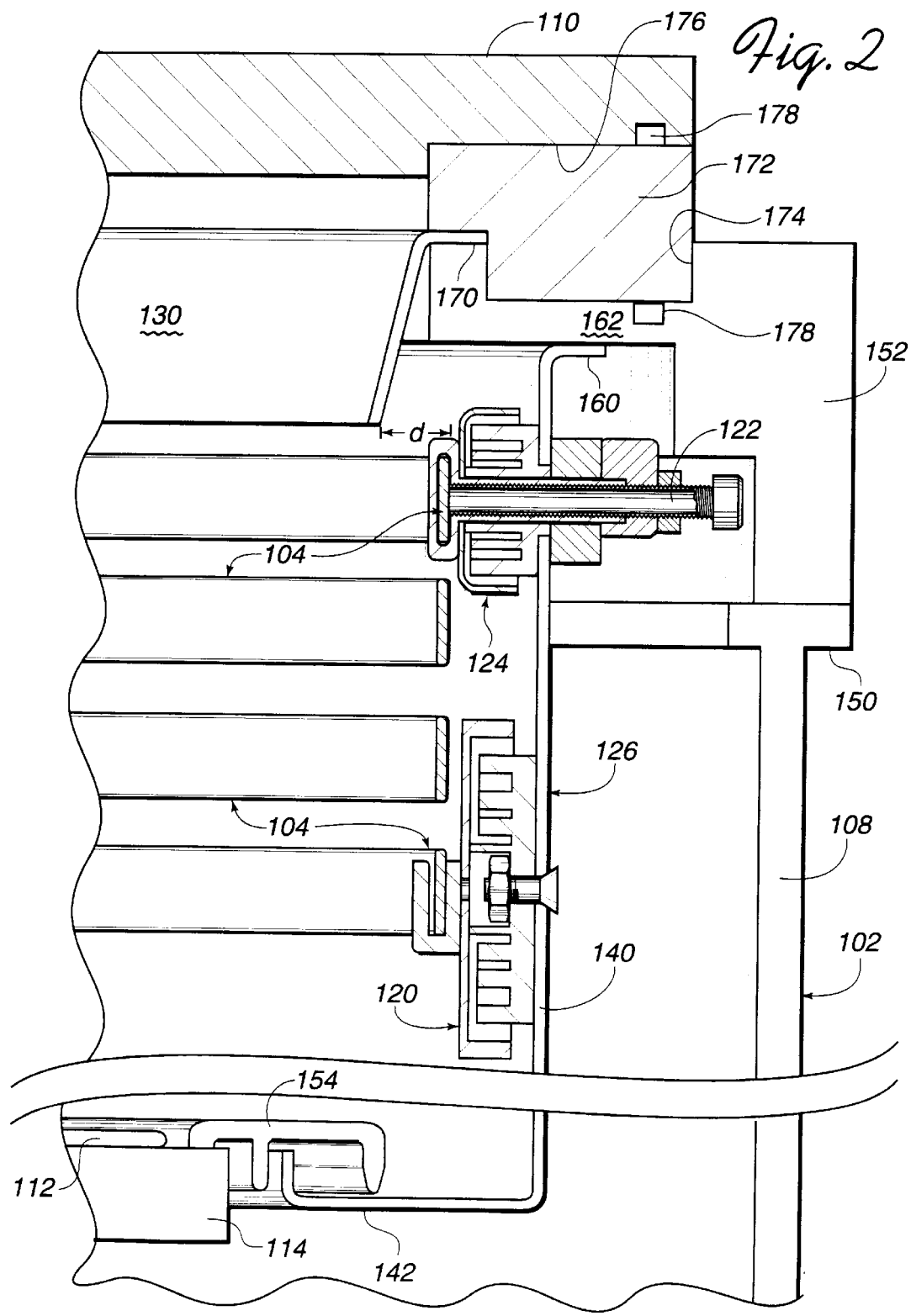
FIG. 2 is a partial cross-sectional view of the plasma generating chamber of FIG. 1 shown installed in a vacuum chamber.
Figure 3:
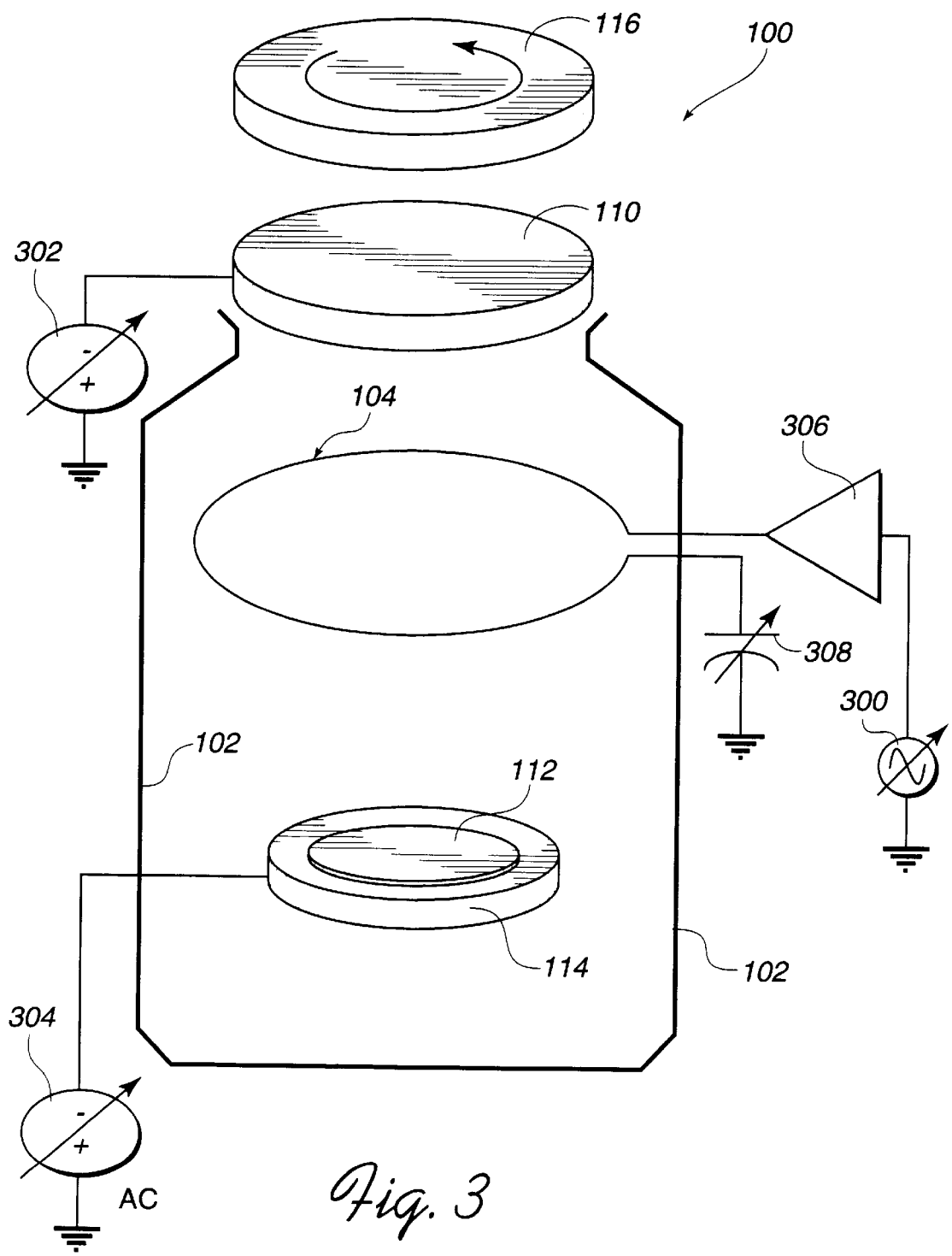
FIG. 3 is a schematic diagram of the electrical interconnections to the plasma generating chambers of FIGS. 1–2.

Referring first to FIGS. 1–3, a plasma generator in accordance with an embodiment of the present invention comprises a substantially cylindrical plasma chamber 100 which is received in a vacuum chamber 102 (FIG. 2). The plasma chamber 100 of this embodiment has a single helical coil 104 which is carried internally of the vacuum chamber walls 108 (FIG. 2) by a chamber shield 106. The chamber shield 106 protects the interior walls 108 (FIG. 2) of the vacuum chamber 102 from the material being deposited within the interior of the plasma chamber 100.

Radio frequency (RF) energy from an RF generator 300 (FIG. 3) is radiated from the coil 104 into the interior of the plasma chamber 100, which energizes a plasma within the plasma chamber 100. An ion flux strikes a negatively biased target 110 positioned above the plasma chamber 100. The plasma ions eject material from the target 110 onto a substrate 112 which may be a wafer or other workpiece supported by a pedestal 114 at the bottom of the plasma chamber 100. A rotating magnet assembly 116 provided above the target 110 produces magnetic fields which sweep over the face of the target 110 to promote uniform erosion by sputtering of the target 110.

As will be explained in greater detail below, in accordance with one aspect of the present invention, the coil 104 is preferably conditioned prior to any sputtering of target material onto the substrate 112 by first sputtering the coil 104 itself to remove any oxides or other contaminants from the coil 104. Such contaminants have been found to promote the shedding of particulate matter from the coils. By removing these contaminants prior to sputtering the target 110, any material which subsequently is deposited onto the coil 104 from the target 110 tends to bond sufficiently well to the coil 104 so as to substantially reduce or eliminate the shedding of particles from the coil 104. As a consequence, contamination of the substrate 112 by particulate matter shed by the coil 104 may be reduced during each subsequent sputtering of the target.

FIG. 3 is a schematic representation of the electrical connections of the plasma generating apparatus of this illustrated embodiment. To sputter target material onto the substrate 112 after the coil 104 has been properly conditioned, the target 110 is preferably negatively biased by a variable DC power source 302 to attract the ions generated by the plasma. In the same manner, the pedestal 114 may be negatively biased by a variable DC power source 304 to bias the substrate 112 negatively to attract the ionized deposition material to the substrate 112. In an alternative embodiment, the pedestal 114 may be biased by a high frequency RF power source to bias the substrate 112 so as to attract the ionized deposition material more uniformly to the substrate 112. In yet another alternative embodiment, as set forth in copending application Ser. No. 08/677,588, entitled "A Method For Providing Full-face High Density Plasma Physical Vapor Deposition," filed Jul. 9, 1996 (Attorney Docket # 1402/PVD/IDV) and assigned to the assignee of the present application, which application is incorporated herein by reference in its entirety, an external biasing of the substrate 112 may be omitted.

One end of the coil 104 is coupled to an RF source such as the output of an amplifier and matching network 306, the input of which is coupled to the RF generator 300. The other end of the coil 104 is coupled to ground, preferably through a capacitor 308, which may be a variable capacitor.

FIG. 2 shows the plasma chamber 100 installed in the vacuum chamber 102 of a physical vapor deposition (PVD) system. Although the plasma generator of the present invention is described in connection with a PVD system for illustration purposes, it should be appreciated that a plasma generator in accordance with the present invention is suitable for use with other semiconductor fabrication processes utilizing a plasma, including plasma etch, chemical vapor deposition (CVD) and various surface treatment processes.

The coil 104 is carried on the chamber shield 106 by a plurality of coil standoffs 120 (FIG. 1) which electrically insulate the coil 104 from the supporting chamber shield 106. In addition, the insulating coil standoffs 120 have an internal labyrinth structure which permits repeated deposition of conductive materials from the target 110 onto the coil standoffs 120 while preventing the formation of a complete conducting path of deposited material from the coil 104 to the chamber shield 106. Such a completed conducting path is undesirable because it could short the coil 104 to the chamber shield 106 (which is typically grounded).

RF power is applied to the coil 104 by feedthrough bolts 122 (FIG. 2) which are supported by insulating feedthrough standoffs 124. An example of suitable standoffs is described more fully in copending application Ser. No. 08/647,182, entitled "Recessed Coil For Generating a Plasma," filed May 9, 1996 (Attorney Docket # 1186/PVD/DV) and assigned to the assignee of the present application, which application is incorporated herein by reference in its entirety. As described therein, the feedthrough standoffs 124, like the coil support standoffs 120, permit repeated deposition of conductive material from the target onto the feedthrough standoff 124 without the formation of a conducting path which could short the coil 104 to the chamber shield 106. As shown in FIG. 2, the coil feedthrough standoff 124, like the coil support standoff 120, has an internal labyrinth structure to prevent the formation of a short between the coil 104 and the wall 126 of the shield. The feedthrough 122 is coupled to the RF generator 300 (shown schematically in FIG. 3) through the matching network 306 (also shown schematically in FIG. 3).

As set forth above, the RF power radiated by the coil 104 energizes the plasma in the chamber to ionize the target material being sputtered from the target 110. The ionized sputtered target material is in turn attracted to the substrate 112 which is at a negative (DC or RF) potential to attract the ionized deposition material to the substrate 112. Unfortunately, the target material has a tendency to deposit not only on the substrate 112 but on every other exposed surface in the chamber. This can be a particular problem for material depositing on RF coils which, because of the relatively sharply curved surfaces, have a tendency to shed particles of the material deposited onto the surface of the substrate 112 which can contaminate the substrate.

In accordance with one aspect of the present invention, it has been found that by conditioning the coil 104 prior to sputtering the target 110, the problem of particulate matter being shed by the coil 104 can be substantially reduced or eliminated even though substantial amounts of target material are subsequently deposited on the coil 104 during normal deposition of target material onto the substrate. More specifically, it has been found that by applying RF power to the coil 104 (but little or no DC power to the target 110) when a new (or recycled) coil 104 is first installed into the chamber, the coil 104 can itself be sputtered to eliminate oxides and other contaminants from the surface of the coil. It is believed that subsequent depositions of target material onto the coil 104 during normal depositions tend to bond more effectively to the coil 104 than if such conditioning of the coil 104 is not performed prior to the commencement of sputtering of the target. As a consequence, it has been found that the shedding of particulate matter by the coil 104 can be substantially reduced or eliminated.

FIG. 4 charts the steps of a typical conditioning process following the installation of a new coil 104. It is believed that this conditioning of the coil 104 may be needed only once just prior to its initial use to energize a plasma to ionize deposition material sputtered from a target. However, in some applications, subsequent reconditioning of the coil 104 may conditions. For example, if the process conditions. For example, if the coil 104 is not used for a significant length of time or is exposed to ambient air, permitting oxides to regrow on the surface of the coil 104, a repeat of the conditioning process may be appropriate. Also, after the coil 104 has been removed for cleaning and recycling, it should be conditioned again as described herein prior to the initial use for ionization of deposition material.

The first step (indicated as step 1 in FIG. 4) is to introduce the flow of the plasma precursor gas (preferably argon) into the chamber which is initially at a high vacuum. In the illustrated embodiment, argon is directed into the chamber at a rate of 62 scc/min. (standard cubic centimeters per minute). At the same time, a cryogenic pump coupled to the chamber by a gate valve is active so as to pump gas from the chamber through the gate valve which is placed at the "mid" position. Once the pressure stabilizes, the process is ready to proceed to step "2." In a typical chamber, it is anticipated that a maximum of 18 seconds will be necessary for the pressure to stabilize.

Once the 18 second period has expired, the process proceeds to step 2 in which RF power is applied to the coil 104 to a level of 1500 watts. To reduce strain on the components, the RF power is preferably increased gradually over a one second period so as to ramp up from the zero level to the full 1500 watt level. The RF power applied to the coil 104 is radiated by the coil into the chamber which ionizes the argon gas to produce a plasma of ionized argon and free electrons. The positively charged argon ions are attracted to the coil 104 and therefore are caused to impact the coil which sputters the surface of the coil. As a result, contaminants such as oxide on the surface of the coil 104 are sputtered off of the coil until the coil surface is substantially free of contaminants. In the illustrated embodiment, the RF power is applied to the coil for a period of 30 seconds. It is anticipated that the coil 104 can be sputtered free or substantially free of contaminants within this period. Since the sputtered contaminants can in turn contaminate a substrate, it is preferred to place a dummy substrate in the chamber to cover the pedestal so that a valuable workpiece is not spoiled by the conditioning process.

During step 2, it is preferred that little or no DC power be applied to the target 110 so as to avoid or minimize sputtering of the target 110. In the illustrated embodiment, a relatively small amount (approximately 100 watts) of DC power is applied to the target 110 to facilitate stabilization of the plasma in the chamber. Sputtering of the target 110 while the coil 104 is being sputtered for conditioning is undesirable because target material sputtered from the target can deposit on the coil 104 and thereby interfere with the sputtering of contaminants from the coil 104. However, 100 watts of DC power applied to the target 110 is believed to produce a relatively small amount (if any) of sputtering of the target 110 such that any target material deposited onto the coil 104 is quickly resputtered off the coil 104. As a consequence, the net effect is that the surface of the coil 104 is sputtered free of contaminants notwithstanding any deposition material being sputtered onto the coil 104 from the target 110. Thus, the DC power to the target preferably should not exceed 500 watts during coil conditioning.

After 30 seconds, the conditioning of the coil 104 is complete and the RF power to the coil 104 and the DC power to the target 110 may be ramped down to zero as indicated in step 3A. In addition, the gate valve may be opened to its fully open position and the inflow of argon gas cut off so as to permit pumping out of the chamber. A cleaning cycle may then be initiated to ready the chamber for the first sputter deposition of target material onto an actual substrate. Alternatively, in some applications, the first actual substrate may be inserted into the chamber (step 3B) immediately following the completion of the coil condition step (step 2) for deposition of sputtered target material.

As best seen in FIG. 2, the plasma chamber 100 of this embodiment has a dark space shield ring 130 which provides a ground plane with respect to the target 110 above, which is negatively biased. An example of a suitable shield ring is explained in greater detail in the aforementioned copending application Ser. No. 08/647,182. As set forth therein, the shield ring 130 shields the outer edges of the target from the plasma to reduce sputtering of the target outer edges. The dark space shield 130 performs yet another function in that it is positioned to shield the coil 104 (and the coil support standoffs 120 and feedthrough standoffs 124) from the material being sputtered from the target 110.

In this illustrated embodiment, the dark space shield 130 is a closed continuous ring of (diamagnetic) titanium or (non-ferromagnetic) stainless steel or (non-magnetic nickel) having a generally inverted frusto-conical shape. The dark space shield extends inward toward the center of plasma chamber 100 so as to overlap the coil 104 by a distanced of ¼ inch. It is recognized, of course, that the amount of overlap can be varied depending upon the relative size and placement of the coil 104 and other factors. For example, the overlap may be increased to increase the shielding of the coil 104 from the sputtered material, but increasing the overlap could also further shield the target 110 from the plasma which may be undesirable in some applications.

The chamber shield 106 is generally bowl-shaped and includes a generally cylindrically shaped, vertically oriented wall 140 to which the standoffs 120 and 124 are attached to insulatively support the coil 104. The shield further has a generally annular-shaped floor wall 142 which surrounds the chuck or pedestal 114 which supports the substrate 112 which has an 8" diameter in the illustrated embodiment. A clamp ring 154 clamps the wafer to the chuck 114 and covers the gap between the floor wall 142 of the chamber shield 106 and the chuck 114. Thus, it is apparent from FIG. 2 that the chamber shield 106 together with the clamp ring 154 protects the interior of the vacuum chamber 102 from the deposition materials being deposited on the substrate 112 in the plasma chamber 100. As described more fully in the aforementioned copending application, Ser. No. 08/677,588, entitled "A Method For Providing Full-face High Density Plasma Physical Vapor Deposition," filed Jul. 9, 1996 (Attorney Docket # 1402/PVD/DV), the clamp ring may be eliminated. The chamber shield 106 also is preferably formed of (diamagnetic) titanium or (non-ferromagnetic) stainless steel or (non-magnetic nickel), like the dark space shield 130.

The vacuum chamber wall 108 has an upper annular flange 150. The plasma chamber 100 is supported by an adapter ring assembly 152 which engages the vacuum chamber wall flange 150. The chamber shield 106 has a horizontally extending outer flange member 160 which is fastened by a plurality of fastener screws (not shown) to a horizontally extending flange member 162 of the adapter ring assembly 152. The chamber shield 106 is grounded to the system ground through the adapter ring assembly 152.

The dark space shield 130 also has an upper flange 170 which is fastened to the horizontal flange 162 of the adapter ring assembly 152. The dark space shield 130, like the chamber shield 106, is grounded through the adapter ring assembly 152.

The target 110 is generally disk-shaped and is also supported by the adapter ring assembly 152. However, the target 110 is negatively biased and therefore should be insulated from the adapter ring assembly 152 which is grounded. Accordingly, seated in a channel 176 formed in the underside of the target 110 is a ceramic insulation ring assembly 172 which is also seated in a corresponding channel 174 in the upper side of the adapter ring assembly 152. The insulation ring assembly 172, which may be made of a variety of insulative materials including ceramics, spaces the target 110 from the adapter ring assembly 152 so that the target 110 may be adequately negatively biased. The target, adapter and ceramic ring assemblies are provided with O-ring sealing surfaces 178 to provide a vacuum tight assembly from the vacuum chamber flange 150 to the target 110.

Although the illustrated embodiment of the present invention has been described primarily in connection with the deposition of titanium and titanium-nitrogen compounds such as titanium nitride, it should be appreciated that the deposition of any thin film material having a tendency to flake off of deposited surfaces would benefit from the use of coils or other surfaces conditioned in accordance with the present invention.

The coil 104 of the illustrated embodiment is made of 2 inch by ⅛ inch heavy duty bead blasted solid high-purity (preferably 99.995% pure) titanium or copper ribbon formed into a three turn helical coil having a diameter of 12–14 inches. However, other highly conductive materials and shapes may be utilized depending upon the material being sputtered and other factors. For example, the ribbon may be as thin as 1/16 inch and made of stainless steel. Also, if the material to be sputtered is aluminum, both the target and the coil should be made of high purity aluminum. Material can be sputtered from the coil 104 at the same time that the same type of material is sputtered from the target 110 to improve deposition uniformity as described in copending application Ser. No. 08/680,335, entitled "Coils for Generating a Plasma and for Sputtering," filed Jul. 10, 1996 (Atty. Docket # 1390CIP/IPVD/CDV). In addition to the ribbon shape illustrated, hollow tubing may be utilized, particularly if water cooling is desired.

In some applications electromagnets may be provided adjacent to the coil 104 but behind the shield 106 to perform a function similar to that of the dark space shield 130 of the embodiment of FIG. 2. More specifically, as described in copending application Ser. No. 08/733,620, pending entitled "A Method to Eliminate Coil Sputtering in ICP Source," filed Oct. 17, 1996 (Atty. Docket # 1457/PVD/DV), magnetic field lines from the magnets activated during target sputtering can magnetically shield the coil 104 to a limited extent from deposition material being ejected from the target 110. Still further, as mentioned above, the magnetic field lines can deflect the energized electrons from the high density plasma away from the coil 104 and around the coil 104 to the grounded chamber shield 106. This prevents the energized electrons from lingering in the immediate vicinity of the coil 104 and ionizing precursor gas atoms and molecules that could sputter material from the coil 104 that could subsequently contaminate the substrate 112.

In the embodiment discussed above, a multiple turn coil 104 is depicted, but, of course, a single turn coil may be used instead. Still further, instead of the ribbon shape coil 104 illustrated, each turn of the coil 104 may be implemented with a flat, open-ended annular ring as described in copending application Ser. No. 08/680,335, entitled "Coils for Generating a Plasma and for Sputtering," filed Jul. 10, 1996 (Attorney Docket # 1390-CIP/PVD/DV) and assigned to the assignee of the present application, which application is incorporated herein by reference in its entirety.

Each of the embodiments discussed above utilized a single coil in the plasma chamber. It should be recognized that the present invention is applicable to plasma chambers having more than one RF powered coil or RF powered shields. For example, the present invention may be applied to multiple coil chambers for launching helicon waves of the type described in aforementioned copending application Ser. No.08/559,345, filed Nov. 15, 1995 and entitled "Method and Apparatus for Launching a Helicon Wave in a Plasma."

The appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the IRF power to the coil 104 is preferably 2 MHz but it is anticipated that the range can vary from, for example, 1 MHz to 4 MHz. An RF power setting of 1.5 kW is preferred but a range of 1.5–5 kW is satisfactory. In addition, a DC power setting for biasing the target 110 of 5 kW is preferred but a range of 2–10 kW and a pedestal 114 bias voltage of −30 volts DC is satisfactory. During conditioning of the coil, a ratio of coil RF power to target DC power in excess of 10 is preferred.

In the illustrated embodiments above, the chamber shield 106 has a diameter of 16", but it is anticipated that satisfactory results can be obtained with a diameter in the range of 6"–25". The shields may be fabricated from a variety of materials including insulative materials such as ceramics or quartz. However, the shield and all metal surfaces likely to be coated with the target material are preferably made of a material such as stainless steel or copper, unless made of the same material as the sputtered target material. The material of the structure which will be coated should have a coefficient of thermal expansion which closely matches that of the material being sputtered to reduce flaking of sputtered material from the shield or other structure onto the wafer. In addition, the material to be coated should have good adhesion to the sputtered material. Thus for example if the deposited material is titanium, the preferred metal of the shields, brackets and other structures likely to be coated is bead blasted titanium. Any surfaces which are more likely to sputter, such as the end caps of the coil and feedthrough standoffs, would preferably be made of the same type of material as the target, such as high purity titanium, for example. Of course, if the material to be deposited is a material other than titanium, the preferred metal is the deposited material, stainless steel, for example. Adherence can also be improved by coating the structures with molybdenum prior to sputtering the target. However, it is preferred that the coil (or any other surface likely to sputter) not be coated with molybdenum or other materials since the molybdenum can contaminate the workpiece if sputtered from the coil.

The wafer to target space is preferably about 140 mm (about 5.5"), but can range from about 1.5" to 8". For this wafer to target spacing, satisfactory stepped wafer bottom coverage has been achieved with a coil diameter of 11.4 inches spaced from the target by a distance of 1.9 inches. It has been found that increasing the diameter of the coil which moves the coil away from the workpiece edge has an adverse effect on bottom coverage. On the other hand, decreasing the coil diameter to move the coil closer to the wafer edge can adversely effect layer uniformity.

Deposition uniformity also appears to be a function of coil spacing from the target. As previously mentioned, a spacing of 1.9 inches between the coil and target has been found satisfactory for a target to wafer spacing of 140 mm. Moving the coil vertically either toward or away from the target (or wafer) can adversely effect deposition layer uniformity.

A variety of precursor gases may be utilized to generate the plasma including Ar, $H_2$, $O_2$ or reactive gases such as $NF_3$, $CF_4$ and many others. Various precursor gas pressures are suitable including pressures of 0.1–50 mTorr. For ionized PVD, a pressure between 10 and 100 mTorr is preferred for best ionization of sputtered material.

It will, of course, be understood that modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. A process of conditioning a coil for energizing a plasma within a semiconductor fabrication system for sputtering material from a target onto a workpiece, the process comprising:
    applying RF power to said coil to ionize a precursor gas; and
    sputtering a surface of said coil for an interval of time sufficient to remove contaminants from said surface of said coil prior to initiating substantial sputtering of said target.

2. A process of conditioning a coil for energizing a plasma within a semiconductor fabrication system for sputtering material from a target onto a workpiece, the process comprising:
    providing a precursor gas; and
    applying RF power to said coil for an interval of time to ionize said precursor gas to provide a net sputtering of a surface of said coil prior to initiating substantial sputtering of said target, said interval of time being sufficient to remove substantially all contaminants from said coil surface.

3. The process of claim 2 further comprising applying biasing power to said target during said interval of time at a level which ensures that any material sputtered from said target and deposited on said coil surface is resputtered from said coil surface during said interval of said RF power applying step.

4. The process of claim 3 wherein the ratio of coil RF power to target biasing power is greater than 10.

5. The process of claim 3 wherein said coil RF power is in the range of 0.1–10 kilowatts and said target biasing power is in the range of 0 to 500 watts.

6. The process of claim 5 wherein said coil RF power is approximately 1500 watts and said target biasing power is approximately 100 watts.

7. A process for sputtering material from a target onto a workpiece, said process comprising:
    applying a first RF power to a coil to ionize a precursor gas to form a plasma;
    sputtering a surface of said coil for an interval of time sufficient to remove contaminants from said coil surface prior to initiating substantial sputtering of said target;
    sputtering said target to sputter target material toward a workpiece after said interval and said contaminants are sputtered from said coil surface; and
    applying a second RF power to said coil to energize a plasma to ionize said sputtered target material before it is deposited onto said workpiece.

8. The process of claim 7 further comprising applying biasing power to said target during said interval of said of coil sputtering step at level which ensures that any material sputtered from said target and deposited on said coil surface is resputtered from said coil surface during said coil sputtering step.

9. The process of claim 8 wherein the ratio of said first coil RF power to target biasing power is greater than 10.

10. The process of claim 8 wherein said first coil RF power is in the range of 0.1–10 kilowatts and said target biasing power is in the range of 0 to 500 watts.

11. The process of claim 8 wherein said first coil RF power is approximately 1500 watts and said target biasing power is approximately 100 watts.

12. An apparatus, for energizing a plasma within a semiconductor fabrication system for sputtering material onto a workpiece, the apparatus comprising:
    a semiconductor fabrication chamber having a plasma generation area within said chamber;
    a sputter target;
    a coil carried by said chamber and positioned to couple energy into said plasma generation area;
    means for sputtering a surface of said coil for an interval of time sufficient to sputter said surface substantially free of contaminants;
and means for preventing substantial sputtering of said target during said interval.

13. The apparatus of claim 1 wherein said target and said coil include titanium.

14. The apparatus of claim 12 wherein said target and said coil include aluminum.

15. The apparatus of claim 12 wherein said preventing means includes means for applying biasing power to said target during said interval of time at a level which ensures that any material sputtered from said target and deposited on said coil surface is resputtered from said coil surface during said interval of said RF power applying step.

16. The apparatus of claim 15 wherein said coil surface sputtering means includes means for applying RF power to said coil during said interval.

17. The apparatus of claim 16 wherein the ratio of coil RF power to target biasing power is greater than 10.

18. The apparatus of claim 16 wherein said coil RF power is in the range of 0.1–10 kilowatts and said target biasing power is in the range of 0 to 500 watts.

19. The apparatus of claim 17 wherein said coil RF power is approximately 1500 watts and said target biasing power is approximately 100 watts.

20. The apparatus of claim 12 further comprising means for sputtering said target to sputter target material toward a workpiece after said interval and said contaminants are sputtered from said coil; and means for applying a second RF power to said coil to energize a plasma to ionize said sputtered target material before it is deposited onto said workpiece.

21. The process of claim 1 wherein said interval of time is approximately 30 seconds.

22. The process of claim 2 wherein said interval of time is approximately 30 seconds.

23. The process of claim 7 wherein said interval of time is approximately 30 seconds.

24. The apparatus of claim 12 wherein said interval of time is approximately 30 seconds.

* * * * *